US009077186B2

(12) United States Patent
Arakawa et al.

(10) Patent No.: US 9,077,186 B2
(45) Date of Patent: Jul. 7, 2015

(54) POWER SUPPLY DEVICE

(75) Inventors: Shinichi Arakawa, Wako (JP);
Yasumichi Ohnuki, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 565 days.

(21) Appl. No.: 13/455,880

(22) Filed: Apr. 25, 2012

(65) Prior Publication Data
US 2012/0274143 A1 Nov. 1, 2012

(30) Foreign Application Priority Data

Apr. 27, 2011 (JP) ................. 2011-099978

(51) Int. Cl.
*H02J 7/00* (2006.01)
*H01M 10/42* (2006.01)
*H01M 10/46* (2006.01)
*H01M 10/48* (2006.01)
*H01M 2/34* (2006.01)
*G01R 31/36* (2006.01)

(52) U.S. Cl.
CPC ............ *H02J 7/0016* (2013.01); *H02J 7/0031* (2013.01); *H01M 2/34* (2013.01); *H01M 10/4207* (2013.01); *H01M 10/425* (2013.01); *H01M 10/46* (2013.01); *H01M 10/482* (2013.01); *H01M 2010/4271* (2013.01); *G01R 31/3658* (2013.01)

(58) Field of Classification Search
USPC .................................. 320/116–120
See application file for complete search history.

(56) References Cited

U.S. PATENT DOCUMENTS

| 7,199,556 | B1 | 4/2007 | Benckenstein, Jr. et al. |
| 7,553,583 | B2 | 6/2009 | Eaves |
| 8,143,855 | B2 | 3/2012 | Davis |
| 2002/0167295 | A1 | 11/2002 | Yamashita |

(Continued)

FOREIGN PATENT DOCUMENTS

| JP | 2003-174738 | 6/2003 |
| JP | 2007-259612 | 10/2007 |

(Continued)

OTHER PUBLICATIONS

European Search Report for Application No. 12165300.0, 7 pages, dated Feb. 7, 2013.

(Continued)

*Primary Examiner* — Binh Tat
(74) *Attorney, Agent, or Firm* — Nelson Mullins Riley & Scarborough LLP; Anthony A. Laurentano

(57) ABSTRACT

A power supply device includes a plurality of power supply units connected in parallel, and includes a positive electrode-side junction formed by the joining of positive electrode-side terminals of the plurality of power supply units and a negative electrode-side junction formed by the joining of negative electrode-side terminals of the plurality of power supply units. Each of the plurality of power supply units includes a battery unit, and a first relay that is provided between one of the positive and negative electrode-side junctions and the battery unit and is electrically disconnectably connected in series to the battery unit. Each of the plurality of power supply units includes a resistive element of which one end is connected between the first relay, which is connected to one of a positive electrode terminal and a negative electrode terminal of the battery unit, and the battery unit.

8 Claims, 13 Drawing Sheets

(56) References Cited

U.S. PATENT DOCUMENTS

| | | | |
|---|---|---|---|
| 2008/0284375 A1* | 11/2008 | Nagaoka et al. | 320/116 |
| 2012/0268079 A1* | 10/2012 | Nakamura | 320/166 |

FOREIGN PATENT DOCUMENTS

| | | |
|---|---|---|
| JP | 2008-35581 | 2/2008 |
| JP | 2008-118790 | 5/2008 |
| JP | 2009-212020 | 9/2009 |
| JP | 2010-45923 | 2/2010 |
| JP | 2011-24404 | 2/2011 |
| JP | 2012-205410 | 10/2012 |
| WO | 2012/086633 A1 | 6/2012 |

OTHER PUBLICATIONS

U.S. Notice of Allowance for U.S. Appl. No. 13/816,919, 12 pages, dated Sep. 27, 2013.

International Search Report for Application No. PCT/JP2011/079481, 4 pages, dated Apr. 3, 2012.

Japanese Notice of Allowance for Application No. 2011-099978, 6 pages, dated May 21, 2013.

* cited by examiner

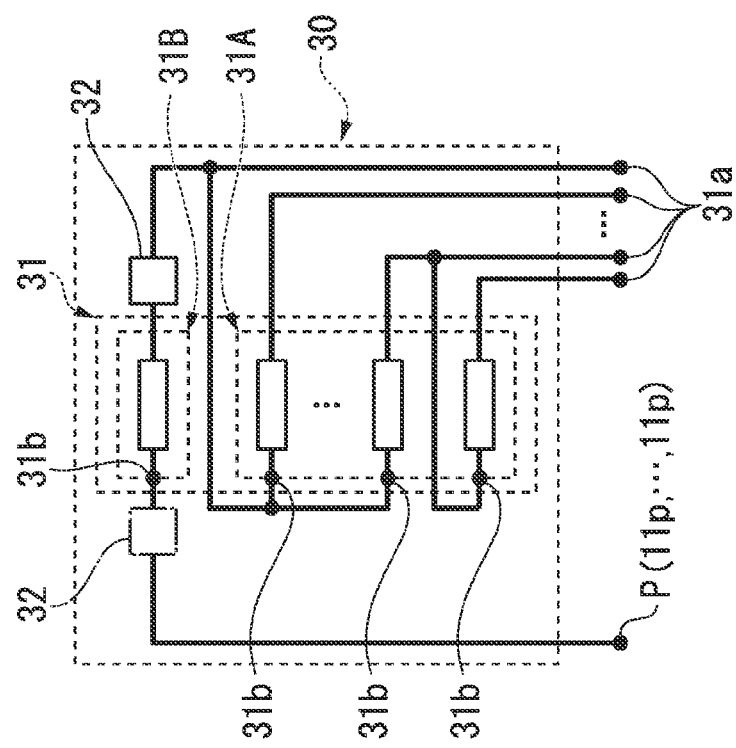

POWER SUPPLY DEVICE

BACKGROUND OF THE PRESENT INVENTION

1. Field of the Present Invention

The present invention relates to a power supply device.

Priority is claimed on Japanese Patent Application No. 2011-099978, filed Apr. 27, 2011, the content of which is incorporated herein by reference.

2. Description of Related Art

All patents, patent applications, patent publications, scientific articles, and the like, which will hereinafter be cited or identified in the present application, will hereby be incorporated by reference in their entirety in order to describe more fully the state of the art to which the present invention pertains.

For example, a power supply device that includes a plurality of batteries connected in parallel has been known. In the power supply device, positive-side main relays are connected in series between an electric load connected to the power supply device and positive electrode-side terminals of the respective batteries, negative-side main relays are connected in series between the electric load and negative electrode-side terminals of the respective batteries, and precharge circuits where resistors and relays for precharge are connected in series are connected in parallel with the positive-side main relays (for example, see Japanese Unexamined Patent Application, First Publication No. 2008-35581).

In the power supply device, the positive-side main relays are opened and the relays of the precharge circuits are connected for the purpose of preventing excessive current flowing to the electric load. Accordingly, current flows through the resistors of the precharge circuits.

Further, for example, an electric storage device that includes a plurality of batteries connected in parallel has been known. In the electric storage device, resistive elements for eliminating the variation of voltage between the plurality of batteries are connected in series between an electric load connected to the electric storage device and positive electrode-side terminals of the batteries, and resistor short-circuit switches are connected in parallel with the resistive elements (for example, see Japanese Unexamined Patent Application, First Publication No. 2009-212020).

In the electric storage device, the resistor short-circuit switches are turned off and the plurality of batteries are connected to each other by the resistive elements for the purpose of eliminating the variation of voltage between the plurality of batteries. Accordingly, current flows through the resistive elements between the plurality of batteries.

Meanwhile, according to the power supply device in the related art, as the number of the batteries connected in parallel is increased, the number of the precharge circuits is also increased. For this reason, the costs required to form the power supply device are increased and the mountability of the power supply device deteriorates due to the increase in the size of the power supply device.

For example, when relays are connected between junctions of the plurality of batteries and a load, it is possible to reduce the number of required relays. However, the current capacities of the relays need to be increased and the costs required to form the power supply device are increased.

Further, if the resistive elements are provided only in order to eliminate the variation of voltage between the plurality of batteries as in the electric storage device in the related art, the costs required to form the device are increased.

SUMMARY

The invention provides a power supply device capable of appropriately preventing the output of excessive current and appropriately eliminating the variation of voltage between a plurality of batteries while suppressing the increase in the costs required to form a device and the increase in the size of a device.

The first aspect of the invention is a power supply device that includes a plurality of power supply units connected in parallel, and includes a positive electrode-side junction formed by the joining of positive electrode-side terminals of the plurality of power supply units and a negative electrode-side junction formed by the joining of negative electrode-side terminals of the plurality of power supply units, wherein each of the plurality of power supply units includes a battery unit, and a first relay that is provided between one of the positive and negative electrode-side junctions and the battery unit and is electrically disconnectably connected in series to the battery unit, each of the plurality of power supply units includes a resistive element of which one end is connected between the first relay, which is connected to one of a positive electrode terminal and a negative electrode terminal of the battery unit, and the battery unit, and the other end of at least one resistive element of the resistive elements of the plurality of power supply units is connected to one ends of the other resistive elements that are other than the at least one resistive element, the power supply device comprising: second relays that cut off current flowing to one of the positive and negative electrode-side junctions connected to the first relays of the plurality of power supply units from the plurality of power supply units through the other resistive elements and allow the flow of the current.

The second aspect of the invention is the power supply device according to the first aspect of the invention, wherein if the number of the other resistive elements is one, the second relays are connected between the other end of the other resistive element and any one, which is connected to the first relays, of the positive and negative electrode-side junctions or between the other resistive element and the other end of the at least one resistive element.

The third aspect of the invention is the power supply device according to the first aspect of the invention, wherein if the number of the other resistive elements is two or more, the second relays are connected between the other ends of the other resistive elements and any one, which is connected to the first relays, of the positive and negative electrode-side junctions.

The fourth aspect of the invention is the power supply device according to any one of the first, second and third aspects of the invention, further comprising: third relays that are electrically disconnectably connected between the other of the positive and negative electrode-side junctions and the battery units.

The fifth aspect of the invention is the power supply device according to the fourth aspect of the invention, further comprising: balancing resistive elements that are provided between the battery units of the plurality of power supply units and the third relays and connect the battery units, wherein the third relays are connected in series to the battery units of the plurality of power supply units and the number of the third relays is equal to the number of the plurality of power supply units.

The sixth aspect of the invention is the power supply device according to the fifth aspect of the invention, wherein the number of the balancing resistive elements is set to m−1 when the number of the battery units is an arbitrary natural number m of 2 or more, and among the m battery units, the battery units of which the number is larger than 1 and smaller than m are connected to the other one battery unit.

The seventh aspect of the invention is the power supply device according to the fifth aspect of the invention, wherein the number of the balancing resistive elements is set to m when the number of the battery units is an arbitrary natural number m of 2 or more, and among the m battery units, all the battery units are connected to the other two battery units.

The eighth aspect of the invention is the power supply device according to any one of the fifth, sixth and seventh aspect of the invention, wherein the battery units of the plurality of power supply units include current sensors on the outside of closed-loop circuits that includes the battery units, the resistive elements, and the balancing resistive elements.

The power supply device according to the first aspect of the invention charges a smoothing capacitor of the power supply device through the resistive elements before the first relays are set to a connection state and has a precharge function of suppressing excessive inrush current when the first relays are set to a connection state.

Moreover, the second relays can cut off current flowing to the plurality of power supply units, which are connected in parallel, through the other resistive elements having one end to which the other end of at least one resistive element, and can allow the flow of the current.

Accordingly, the number of the second relays is smaller than the number of the plurality of power supply units. As compared to, for example, a case where each of the power supply units is provided with the second relays, it is possible to suppress the increase in the costs required to form the power supply device and to suppress the deterioration of the mountability of the power supply device that is caused by the increase in the size of the power supply device.

Further, closed circuits where the plurality of battery units are connected to each other by the resistive elements are formed. Accordingly, it is possible to appropriately eliminate the variation of voltage (the variation of capacity) between the plurality of battery units without requiring, for example, special circuit elements.

Furthermore, according to the power supply device of the second aspect of the invention, if the number of the other resistive elements is one, it is possible to cut off current flowing to one of the positive and negative electrode-side junctions and to allow the flow of the current by the second relays that are connected to one end or the other end of the other resistive element.

Moreover, according to the power supply device of the third aspect of the invention, if the number of the other resistive elements is two or more, it is possible to cut off current flowing to one of the positive and negative electrode-side junctions and to allow the flow of the current by the second relays that are connected to the other ends of the other resistive elements.

In addition, the power supply device according to the fourth aspect of the invention includes third relays that are electrically disconnectably connected between the battery units and the other of the positive and negative electrode-side junctions, that is, the junction, where the first relays are not connected between the battery units, and the battery units, in addition to the first relays.

Accordingly, even though abnormality occurs in, for example, the first relays, it is possible to appropriately disconnect the battery units from an external electric load by way of the third relays.

Further, the power supply device according to the fifth aspect of the invention includes balancing resistive elements that are provided between the battery units of the plurality of power supply units and the third relays and connect the plurality of battery units.

Accordingly, closed-loop circuits where the plurality of battery units are connected to each other by the balancing resistors and the resistive elements are formed regardless of the connection/disconnection states of the third relays. Accordingly, it is possible to appropriately eliminate the variation of voltage (the variation of capacity) between the plurality of battery units.

Furthermore, according to the power supply device of the sixth aspect of the invention, it is possible to appropriately eliminate the variation of voltage (the variation of capacity) between the plurality of battery units while preventing the number of required balancing resistive elements from being excessively increased.

Moreover, according to the power supply device of the seventh aspect of the invention, it is possible to connect m balancing resistive elements to m battery units by delta connection. Accordingly, even though abnormality occurs in one balancing resistive element, it is possible to appropriately maintain closed-loop circuits and to appropriately eliminate the variation of voltage (the variation of capacity) between the plurality of battery units.

In addition, according to the power supply device of the eighth aspect of the invention, current sensors are provided on the outside of closed-loop circuits. Therefore, it is possible to appropriately calibrate the current sensors.

BRIEF DESCRIPTION OF THE DRAWINGS

The above features and advantages of the present invention will be more apparent from the following description of certain preferred embodiments taken in conjunction with the accompanying drawings, in which:

FIGS. 4A and 4B are views showing an example of the configuration of the precharge unit of the power supply device according to the embodiment of the invention.

Figure 12:
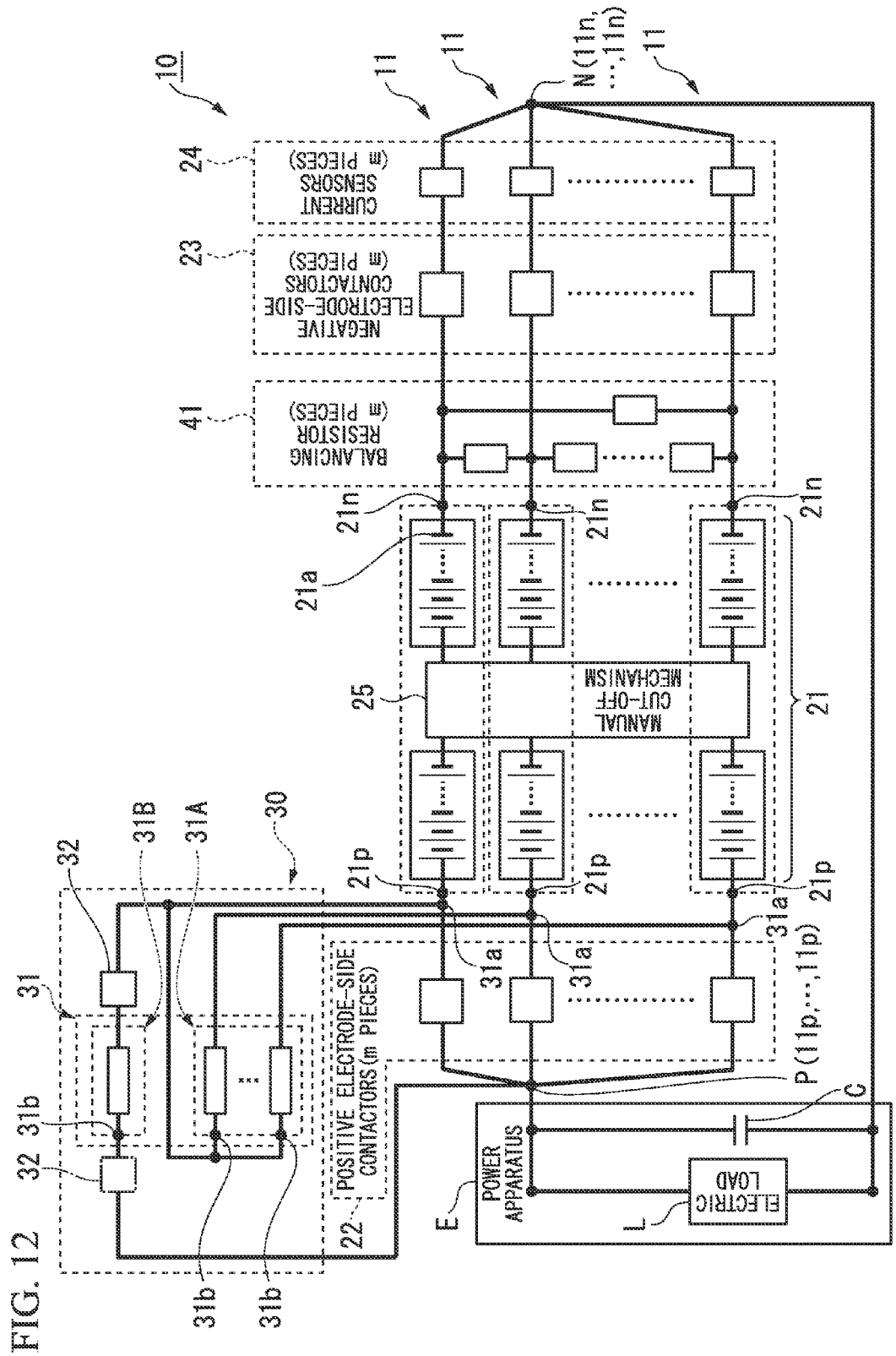

FIG. 12 is a view showing the configuration of a power supply device according to a third modification of the embodiment of the invention.

Figure 13:
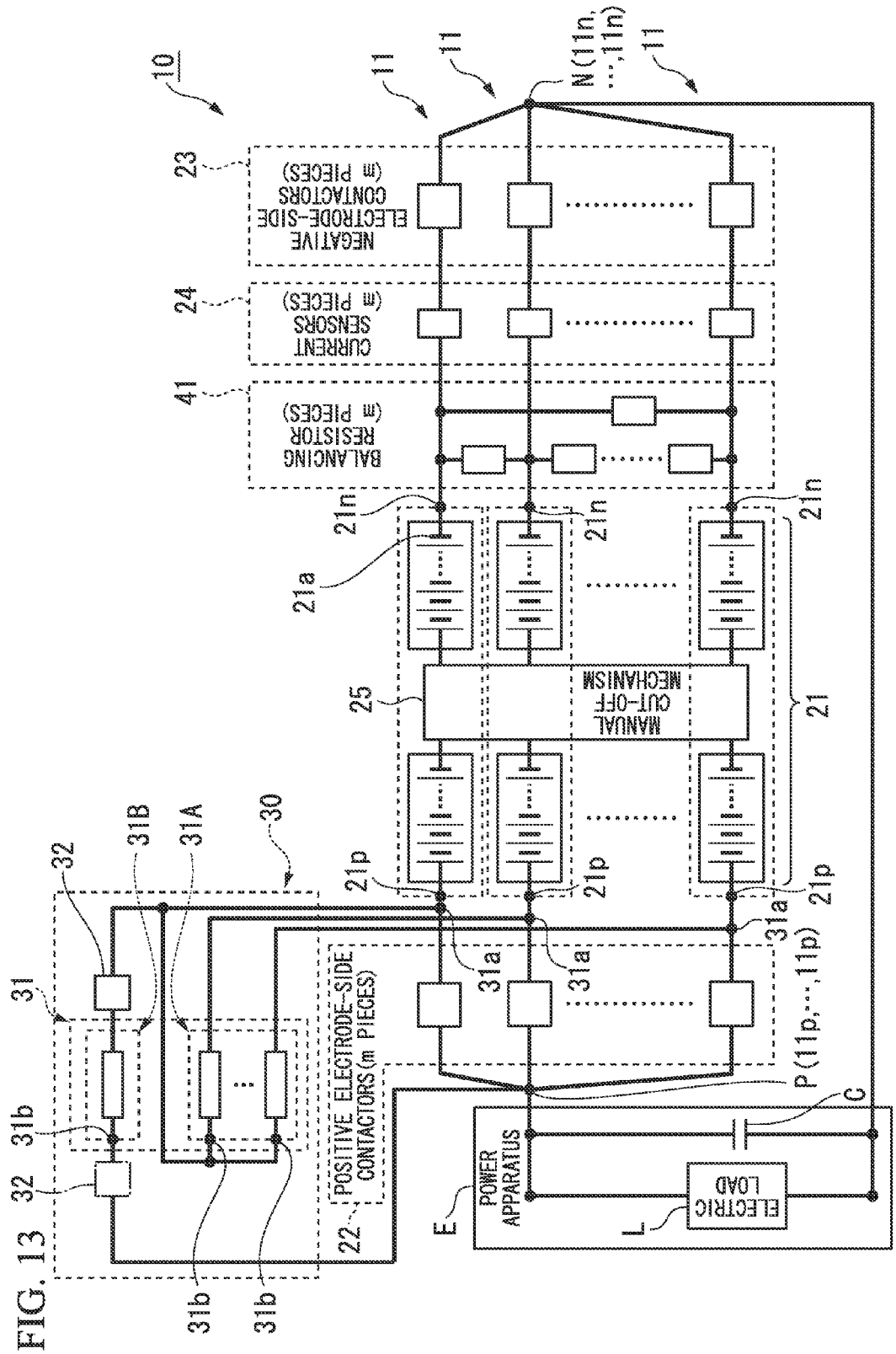

FIG. 13 is a view showing the configuration of a power supply device according to a fourth modification of the embodiment of the invention.

Figure 14:
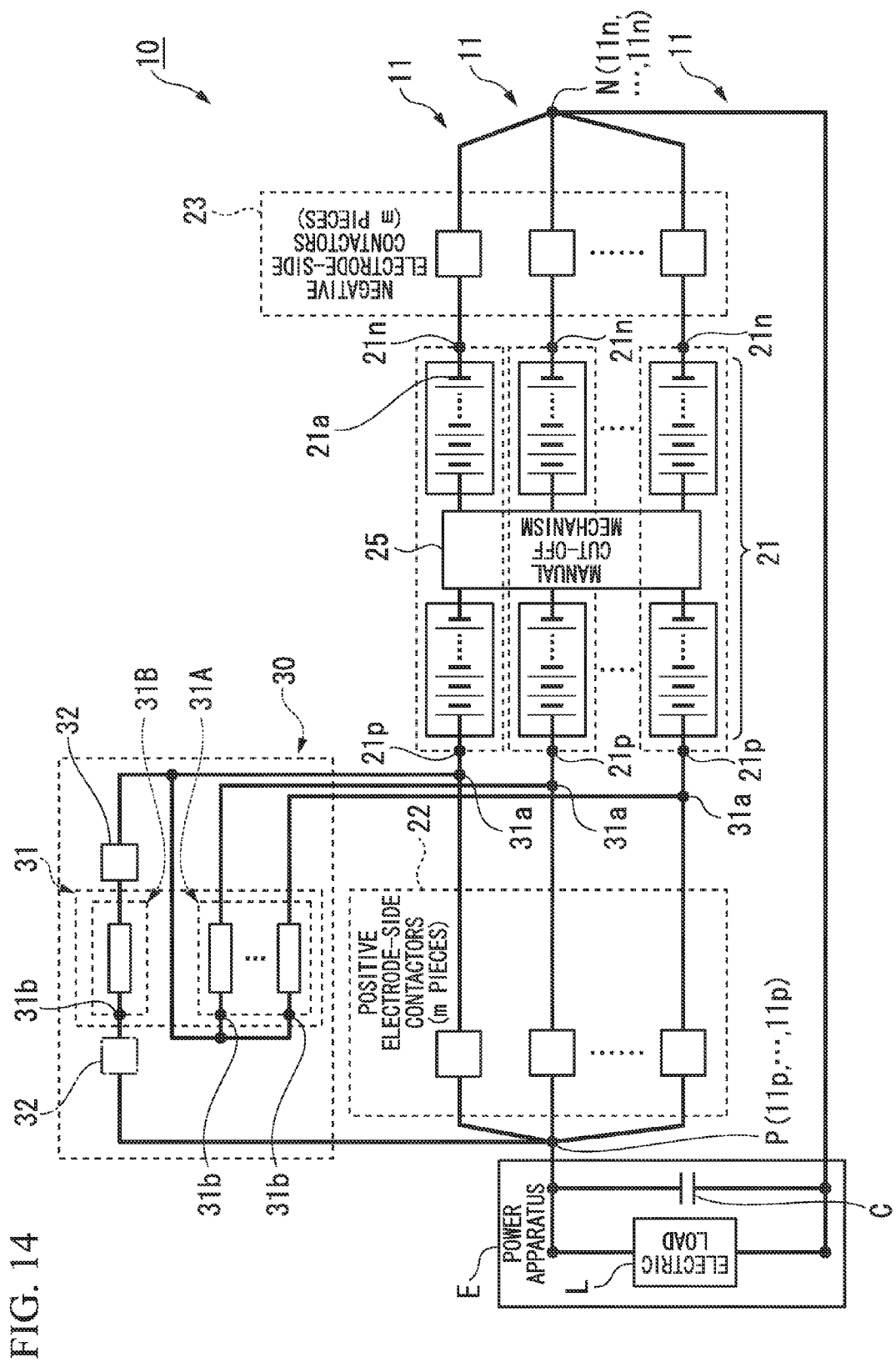

FIG. 14 is a view showing the configuration of a power supply device according to a fifth modification of the embodiment of the invention.

Figure 15:
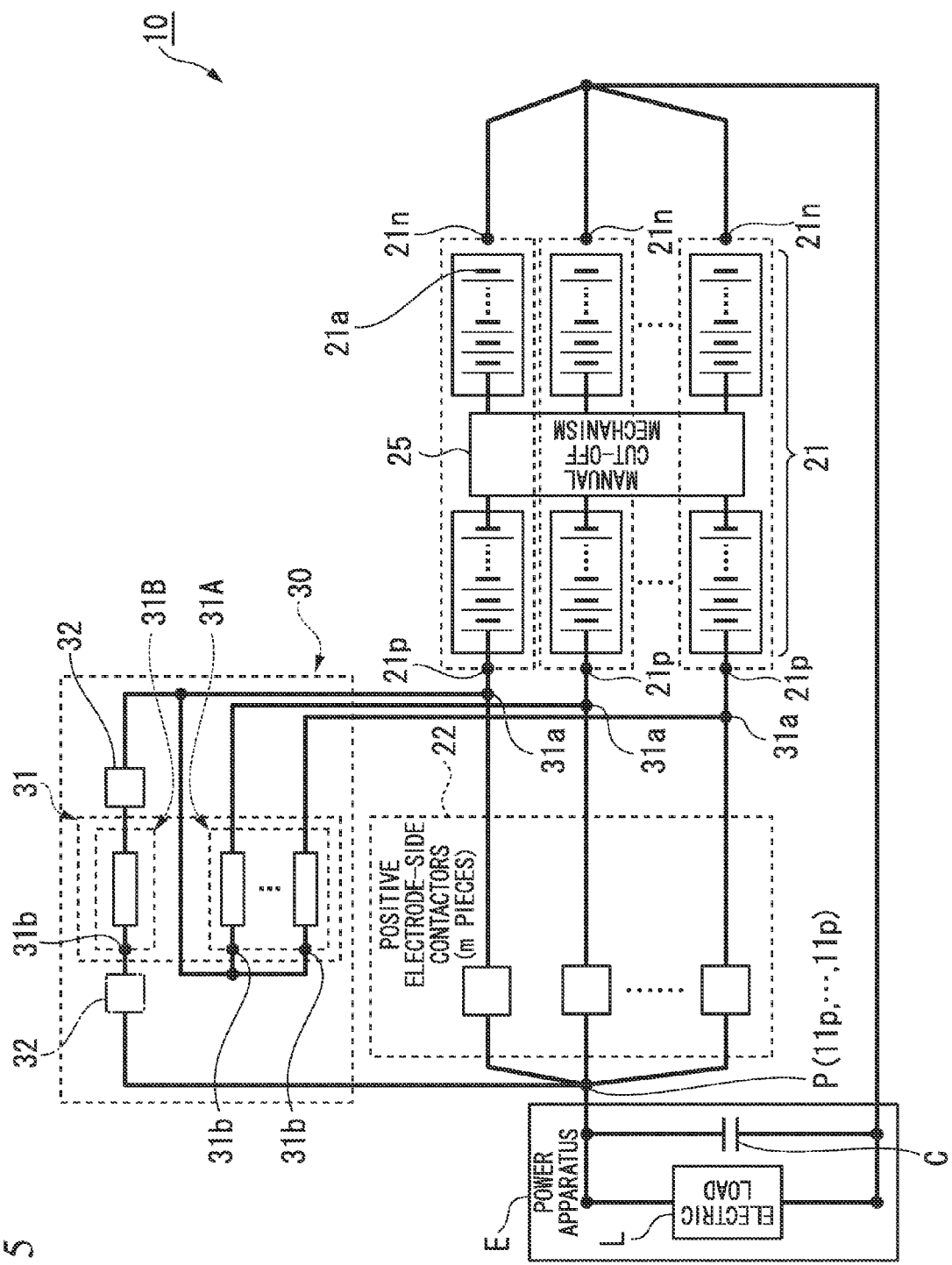

FIG. 15 is a view showing the configuration of a power supply device according to a sixth modification of the embodiment of the invention.

DETAILED DESCRIPTION OF THE PRESENT INVENTION

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

Figure 1:
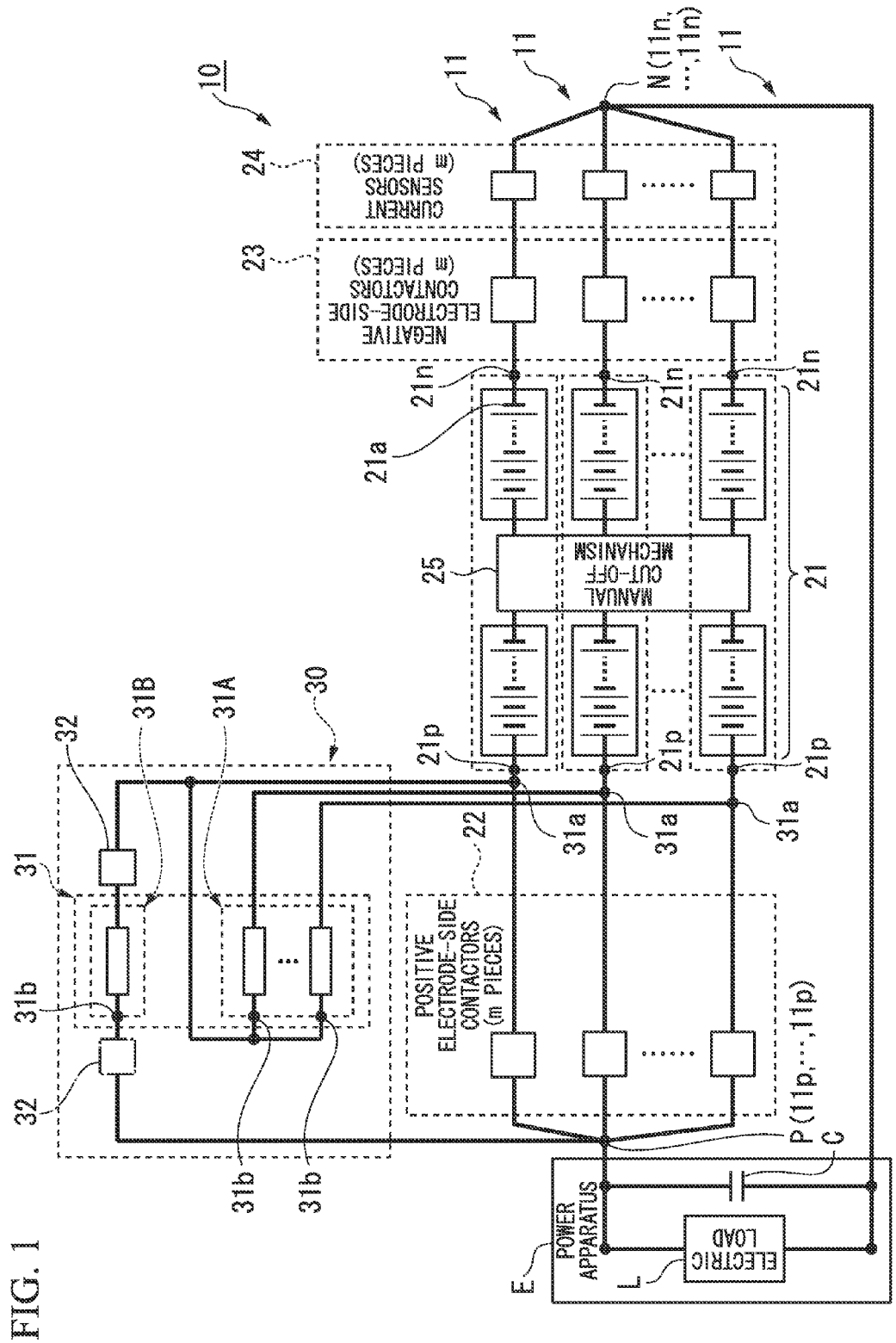
FIG. 1 is a view showing the configuration of a power supply device according to an embodiment of the invention.

A power supply device 10 according to this embodiment includes multiple, that is, m power supply units 11, . . . , 11 that are connected in parallel (m is a natural number of 2 or more) as shown in, for example, FIG. 1. The power supply device 10 includes a positive electrode-side junction P that is formed by the joining of positive electrode-side terminals 11p of the m power supply units 11, . . . , 11; and a negative electrode-side junction N that is formed by the joining of negative electrode-side terminals 11n of the power supply units 11.

That is, the positive electrode-side junction P and the negative electrode-side junction N of the power supply device 10 form a positive electrode-side output terminal and a negative electrode-side output terminal that are connected to external appropriate power apparatus E. m power supply units 11, . . . , 11 are connected in parallel to the positive electrode-side output terminal and the negative electrode-side output terminal.

Meanwhile, the external appropriate power apparatus E includes, for example, a smoothing capacitor C and an electric load L that are connected in parallel between the positive electrode-side output terminal and the negative electrode-side output terminal.

Each of the power supply units 11 includes, for example, a battery unit 21 that is formed of a plurality of battery cells 21a, . . . , 21a connected in series; a positive electrode-side contactor 22 that is electrically disconnectably connected in series between a positive electrode terminal 21p of the battery unit 21 and the positive electrode-side junction P; a negative electrode-side contactor 23 that is electrically disconnectably connected in series between a negative electrode terminal 21n of the battery unit 21 and the negative electrode-side junction N; and a current sensor 24 that is connected in series between the negative electrode-side contactor 23 and the negative electrode-side junction N.

Meanwhile, the battery unit 21 includes, for example, a manual cut-off mechanism 25 that is provided at an appropriate connection position between the plurality of battery cells 21a, . . . , 21a connected in series and is formed of a switch or the like capable of being connected and disconnected by the operation of an operator.

Further, the power supply device 10 includes a precharge unit 30 between the positive electrode-side junction P and the positive electrode terminals 21p of the power supply units 11.

The precharge unit 30 includes precharge resistors 31 each of which one end 31a is connected between each positive electrode-side contactor 22 and the positive electrode terminal 21p of the battery unit 21 of each power supply unit 11, and one precharge contactor 32.

The other end 31b of at least one precharge resistor 31 (31A) among m precharge resistors 31, . . . , 31 of m power supply units 11, . . . , 11 is connected to one end 31a of the other precharge resistors 31 (31B).

Moreover, the precharge contactor 32 can cut off current that flows to the positive electrode-side junction P from the power supply units 11 through the other precharge resistors 31 (31B), and can allow the flow of the current.

If the number of the other precharge resistors 31 (31B) is one, the precharge contactor 32 is connected in series between the other end 31b of the other precharge resistor 31 (31B) and the positive electrode-side junction P or between the other precharge resistor 31 (31B) and the other end 31b of at least one precharge resistor 31 (31A).

Further, if the number of the other precharge resistors 31 (31B) is two or more, the precharge contactor 32 is connected in series between the other ends 31b of the other precharge resistors 31 (31B) and the positive electrode-side junction P.

For example, in the power supply device 10 shown in FIG. 1, the other ends 31b, . . . , 31b of m−1 precharge resistors 31 (31A), . . . , 31 (31A) among m precharge resistors 31, . . . , 31 are connected to one end 31a of one other precharge resistor 31 (31B).

Further, the one precharge contactor 32 is connected in series between one other precharge resistor 31 (31B) and the other ends 31b, . . . , 31b of m−1 precharge resistors 31 (31A), . . . , 31 (31A) or between the other end 31b of one other precharge resistor 31 (31B) and the positive electrode-side junction P.

Figure 2:
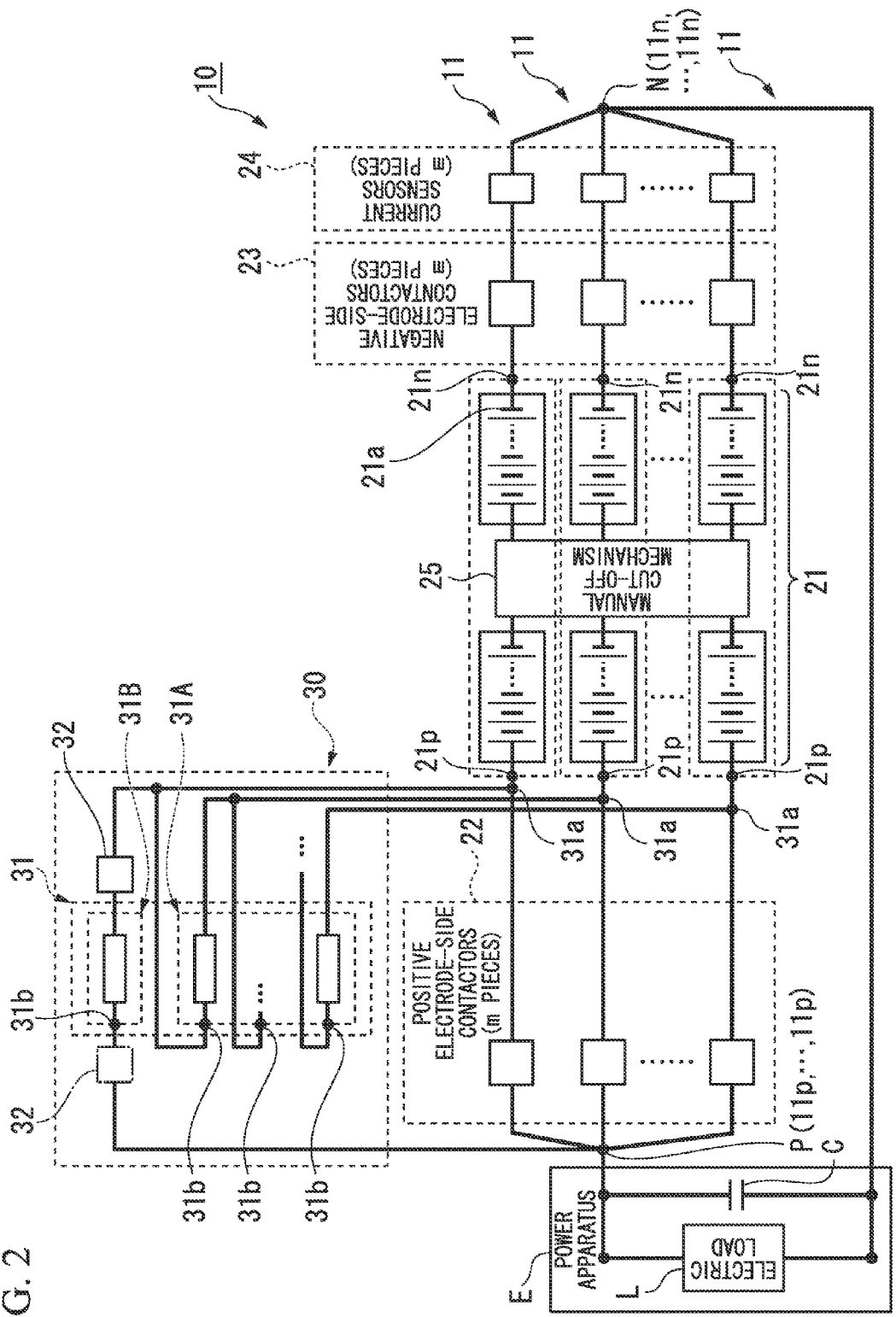
FIG. 2 is a view showing an example of the configuration of a precharge unit of the power supply device according to the embodiment of the invention.

Furthermore, for example, in a power supply device 10 shown in FIG. 2, m−1 precharge resistors 31 (31A), . . . , 31 (31A) among m precharge resistors 31, . . . , 31 are connected in series so that the one ends 31a and the other ends 31b of the precharge resistors are connected to each other. In addition, the other end 31b of this series connection is connected to one end 31a of one other precharge resistor 31 (31B).

Further, one precharge contactor 32 is connected in series between one other precharge resistor 31 (31B) and the other end 31b of the series connection of m−1 precharge resistors 31 (31A), . . . , 31 (31A), or between the other end 31b of one other precharge resistor 31 (31B) and the positive electrode-side junction P.

Figure 3:
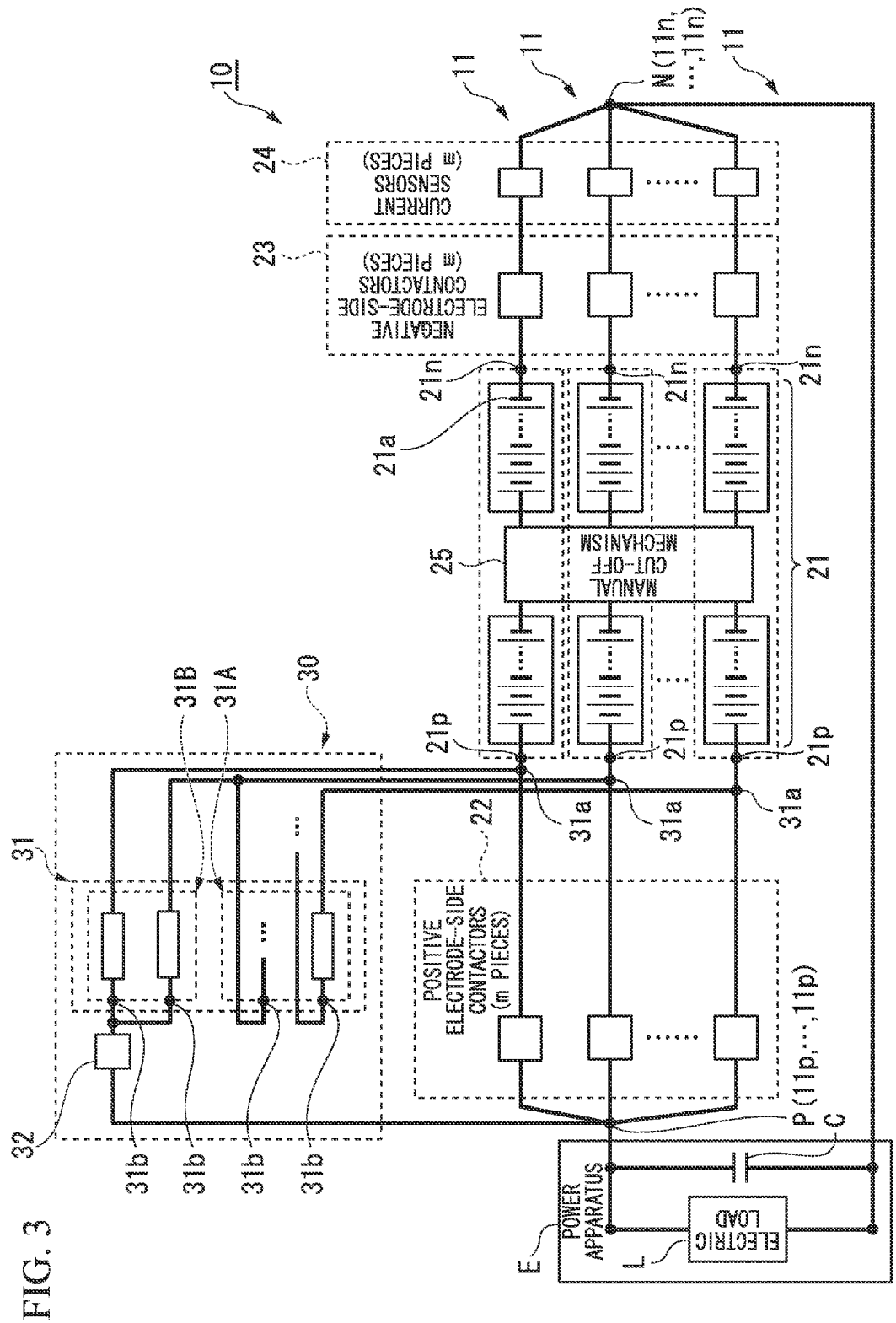
FIG. 3 is a view showing an example of the configuration of the precharge unit of the power supply device according to the embodiment of the invention.

Furthermore, for example, in a power supply device 10 shown in FIG. 3, m−2 precharge resistors 31 (31A), . . . , 31 (31A) among m precharge resistors 31, . . . , 31 are connected in series so that the one ends 31a and the other ends 31b the precharge resistors are connected to each other. In addition, the other end 31b of this series connection is connected to one end 31a of one of two other precharge resistors 31 (31B) and 31 (31B).

Further, the other ends 31b and 31b of two other precharge resistors 31 (31B) and 31 (31B) are connected to one precharge contactor 32.

The one precharge contactor 32 is connected in series between the other ends 31b and 31b of two other precharge resistors 31 (31B) and 31 (31B) and the positive electrode-side junction P.

Furthermore, for example, in a precharge unit 30 shown in FIG. 4A, the other ends 31b, . . . , 31b of m−2 precharge resistors 31 (31A), . . . , 31 (31A) among m precharge resistors 31, . . . , 31 are connected to one end 31a of one other precharge resistor 31 (31A) and the other end 31b of the one other precharge resistor 31 (31A) is connected to one end 31a of one other precharge resistor 31 (31B).

Moreover, one precharge contactor 32 is connected in series between one other precharge resistor 31 (31B) and the other end 31b of the series connection of m−2 precharge resistors 31 (31A), . . . , 31 (31A) and one precharge resistor 31 (31A), or between the other end 31b of one other precharge resistor 31 (31B) and the positive electrode-side junction P.

Further, for example, in a precharge unit 30 shown in FIG. 4B, two precharge resistors 31 (31A) and 31 (31A) among m precharge resistors 31, . . . , 31 are connected in series so that one end 31a and the other end 31b of the precharge resistors are connected to each other. Furthermore, the other end 31b of this series connection and the other ends 31b, . . . , 31b of m−3 precharge resistors 31 (31A), . . . , 31 (31A) are connected to one end 31a of one other precharge resistor 31 (31B).

Moreover, one precharge contactor 32 is connected in series between one other precharge resistor 31 (31B) and the other end 31b of the series connection of two precharge resistors 31 (31A) and 31 (31A) and the other ends 31b, . . . , 31b of m−3 precharge resistors 31 (31A), . . . , 31 (31A), or between the other end 31b of one other precharge resistor 31 (31B) and the positive electrode-side junction P.

Figure 5A:
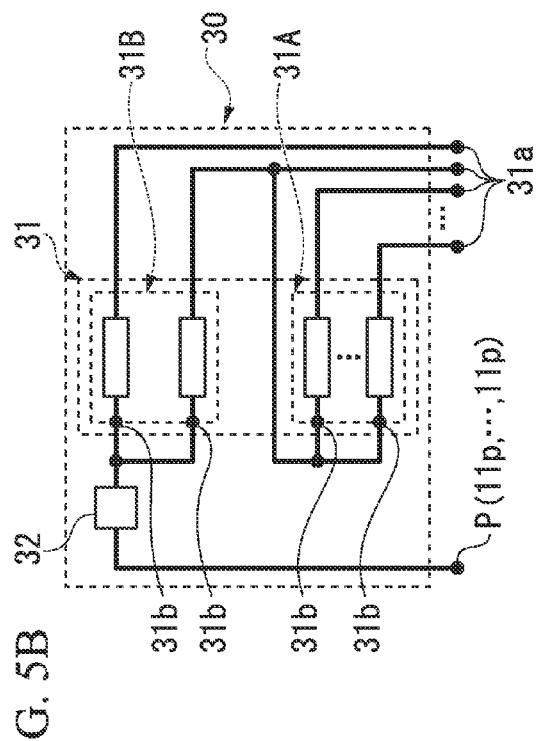
FIGS. 5A, 5B and 5C are views showing an example of the configuration of the precharge unit of the power supply device according to the embodiment of the invention.

Further, for example, in a precharge unit 30 shown in FIG. 5A, among m precharge resistors 31, . . . , 31, each of a plurality of precharge resistors 31 (31A), . . . , 31 (31A) and each of a plurality of other precharge resistor 31 (31B), . . . , 31 (31B) are connected in series, so that a plurality of series connections are formed.

Furthermore, one precharge contactor 32 is connected in series between the other ends 31b of the other precharge resistors 31 (31B) of the plurality of series connections and the positive electrode-side junction P.

Figure 5B:
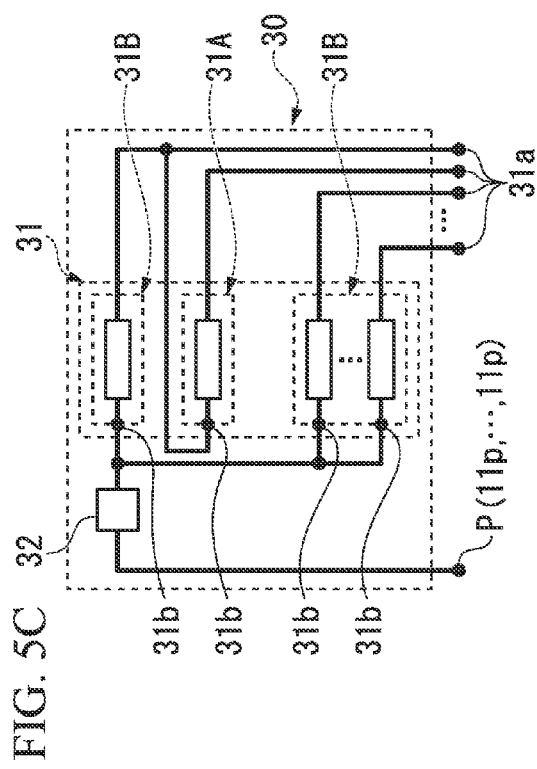

Moreover, for example, in a precharge unit 30 shown in FIG. 5B, among m precharge resistors 31, . . . , 31, the other ends 31b, . . . , 31b of m−2 precharge resistors 31 (31A), . . . , 31 (31A) are connected to one end 31a of one of two other precharge resistors 31 (31B) and 31 (31B).

Further, the other ends 31b and 31b of the two other precharge resistors 31 (31B) and 31 (31B) are connected to one precharge contactor 32.

The one precharge contactor 32 is connected in series between the other ends 31b and 31b of the two other precharge resistors 31 (31B) and 31 (31B) and the positive electrode-side junction P.

Figure 5C:
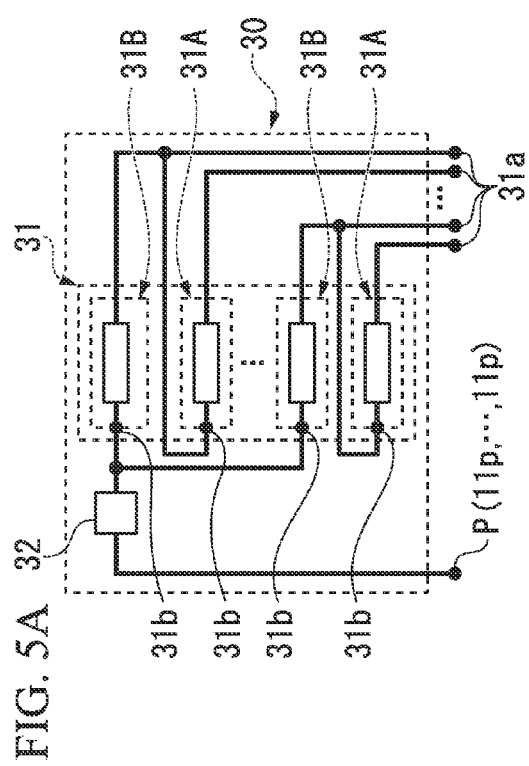

Furthermore, for example, a precharge unit 30 shown in FIG. 5C, among m precharge resistors 31, . . . , 31, one precharge resistor 31 (31A) and one other precharge resistor 31 (31B) are connected in series to each other and the other end 31b of this series connection and the other ends 31b, . . . , 31b of m−2 precharge resistor 31 (31B), . . . , 31 (31B) are connected to one precharge contactor 32.

The one precharge contactor 32 is connected in series between the positive electrode-side junction P and the other end 31b of the series connection of one precharge resistor 31 (31A) and one other precharge resistor 31 (31B) and the other ends 31b, . . . , 31b of m−2 other precharge resistor 31 (31B), . . . , 31 (31B).

Meanwhile, in the power supply device 10, the number (m) of the plurality of battery units 21, . . . , 21, the number (m) of the plurality of positive electrode-side contactors 22, . . . , 22, the number (m) of the plurality of negative electrode-side contactors 23, . . . , 23, the number (m) of a plurality of current sensors 24, . . . , 24, and the number (m) of the plurality of precharge resistors 31, . . . , 31 are equal to each other; and the number (one) of the precharge contactor 32 is set to a numeral smaller than the number (m) of these.

The power supply device 10 according to this embodiment has the above-mentioned configuration, and the operation of the power supply device 10 will be described next.

For example, when a difference between the voltage of the power supply device 10 and the voltage of the smoothing capacitor C is greater than or equal to a predetermined value such as when power begins to be supplied to an external electric load L from the power supply device 10, first, current is made to flow through the respective precharge resistors 31 so that the smoothing capacitor C is gradually charged. Accordingly, the positive electrode-side contactors 22 are set to a disconnection state and the respective negative electrode-side contactors 23 and the precharge contactor 32 are set to a connection state.

Therefore, it is possible to suppress the flow of excessive inrush current, and to prevent the generation of a problem such as the welding of electrical contacts that are provided at, for example, the contactors 22 and 23.

Further, after the difference between the voltage of the power supply device 10 and the voltage of the smoothing capacitor C becomes smaller than the predetermined value, current is made to flow through the respective positive electrode-side contactors 22. Accordingly, the precharge contactor 32 is set to a disconnection state and the respective positive electrode-side contactors 22 and the respective negative electrode-side contactors 23 are set to a connection state.

In this state, closed circuits where m battery units 21, . . . , 21 are connected to each other by m−1 precharge resistors 31, . . . , 31 are formed between the other ends 31b, . . . , 31b of m−1 precharge resistors 31 (31A), . . . , 31 (31A) and the negative electrode-side junction N. Accordingly, the variation of voltage (the variation of capacity) between m battery units 21, . . . , 21 is eliminated, so that voltage and capacity are equalized.

As described above, according to the power supply device 10 of this embodiment, one precharge contactor 32 is provided so as to cut off current, which flows to the positive electrode-side junction P through the precharge resistors 31 for the plurality of power supply units 11, . . . , 11, and allow the flow of the current.

Accordingly, when the precharge contactor 32 is in a connection state, current flows through the precharge resistors 31. Therefore, it is possible to appropriately prevent excessive current from flowing through an external power apparatus E that is connected to the power supply device 10.

That is, the power supply device 10 charges the smoothing capacitor C of the power supply device 10 through the precharge resistors 31 before the positive electrode-side contactors 22 are set to a connection state and has a precharge function of suppressing excessive inrush current when the positive electrode-side contactors 22 are set to a connection state.

Moreover, as for m power supply units 11, . . . , 11 connected in parallel, the number (one) of the precharge contactor 32 is smaller than the number of the power supply units 11, . . . , 11. Accordingly, as compared to, for example, the case where each of the power supply units 11, . . . , 11 is provided with the precharge contactor 32, it is possible to suppress the increase of the costs required to form the power supply device and to suppress the deterioration of the mountability of the power supply device that is caused by the increase in the size of the power supply device.

Further, closed circuits where m battery units 21, . . . , 21 are connected to each other by m−1 precharge resistors 31

(31A), ..., 31 (31A) are formed. Accordingly, it is possible to appropriately eliminate the variation of voltage (the variation of capacity) between the plurality of battery units 21, ..., 21 without requiring, for example, special circuit elements.

Furthermore, the power supply device includes the negative electrode-side contactors 23 that are electrically disconnectably connected in series between the negative electrode terminals 21n of the battery units 21 and the negative electrode-side junction N, in addition to the respective positive electrode-side contactors 22. Accordingly, even though abnormality occurs in, for example, the positive electrode-side contactors 22, it is possible to appropriately disconnect the battery units 21 from the external power apparatus E by the negative electrode-side contactors 23.

Meanwhile, the power supply device has included one precharge contactor 32 in the above-mentioned embodiment. However, the invention is not limited thereto, and the power supply device may include a plurality of precharge contactors 32, ..., 32 of which the number (two or more and equal to or smaller than m−1) is smaller than the number of the plurality of (m) power supply units 11, ..., 11.

In this case, even though abnormality occurs in one precharge contactor 32, it is possible to use other normal precharge contactors 32.

Figure 6:
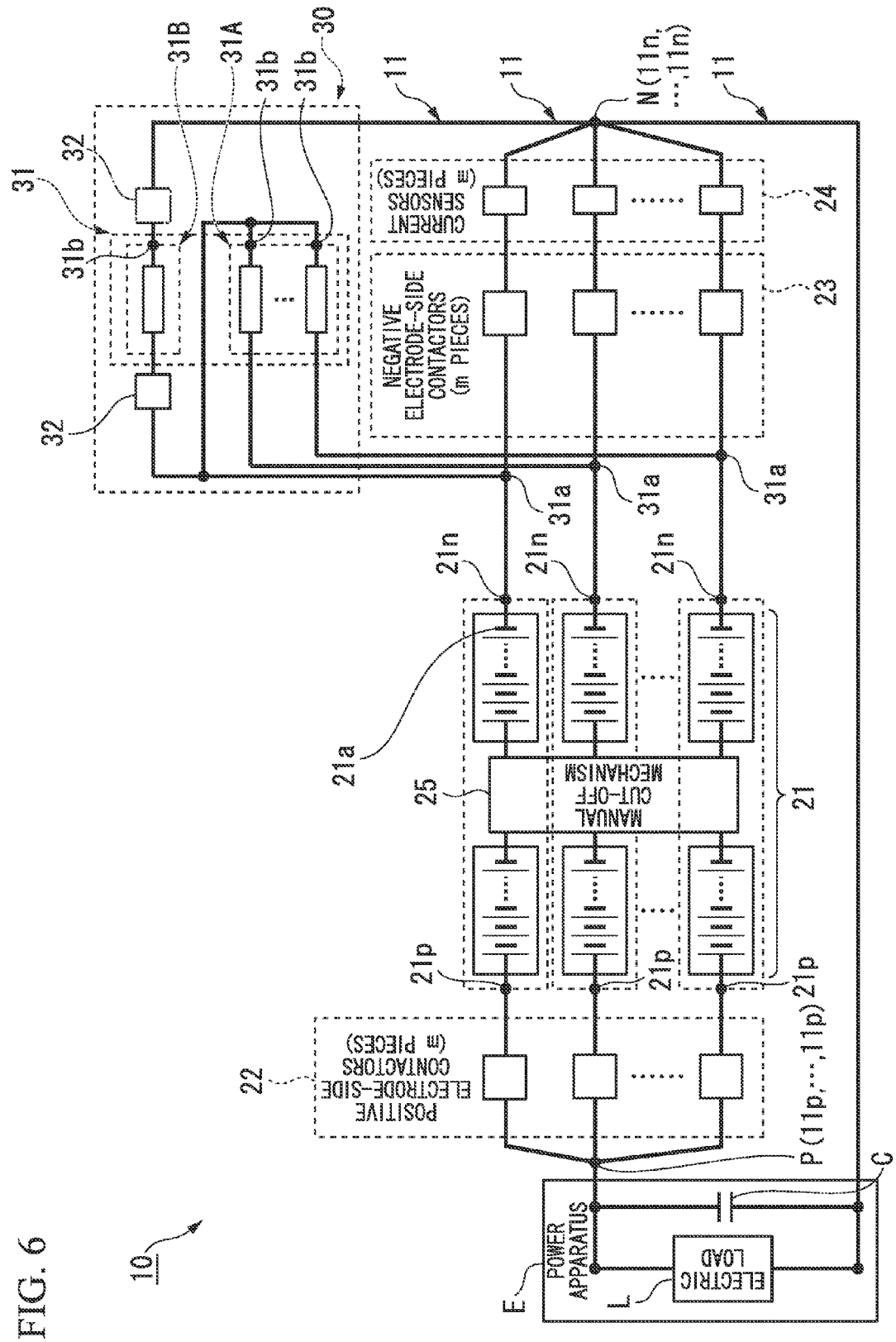
FIG. 6 is a view showing an example of the configuration of a power supply device according to a first modification of the embodiment of the invention.

Meanwhile, the precharge unit 30 has been provided on the side close to the positive electrodes of the battery units 21 in the above-mentioned embodiment. However, the invention is not limited thereto, and the precharge unit 30 may be provided on the side close to the negative electrodes of the battery units 21 as in, for example, a power supply device 10 according to a first modification of the above-mentioned embodiment shown in FIG. 6.

The power supply device 10 according to the first modification includes the precharge unit 30 between the negative electrode terminals 21n of the power supply units 11 and the negative electrode-side junction N.

The precharge unit 30 includes precharge resistors 31 each of which one end 31a is connected between each negative electrode-side contactor 23 and the negative electrode terminal 21n of the battery unit 21 of each power supply unit 11, and one precharge contactor 32.

The other end 31b of at least one precharge resistor 31 (31A) among m precharge resistors 31, ..., 31 of m power supply units 11, ..., 11 is connected to one end 31a of the other precharge resistor 31 (31B).

Moreover, the precharge contactor 32 can cut off current that flows to the negative electrode-side junction N from the power supply units 11 through the other precharge resistor 31 (31B), and can allow the flow of the current.

If the number of the other precharge resistors 31 (31B) is one, the precharge contactor 32 is connected in series between the other end 31b of the other precharge resistor 31 (31B) and the negative electrode-side junction N or between the other precharge resistor 31 (31B) and the other end 31b of at least one precharge resistor 31 (31A).

Further, if the number of the other precharge resistors 31 (31B) is two or more, the precharge contactor 32 is connected in series between the other ends 31b of the other precharge resistors 31 (31B) and the negative electrode-side junction N.

Figure 7:
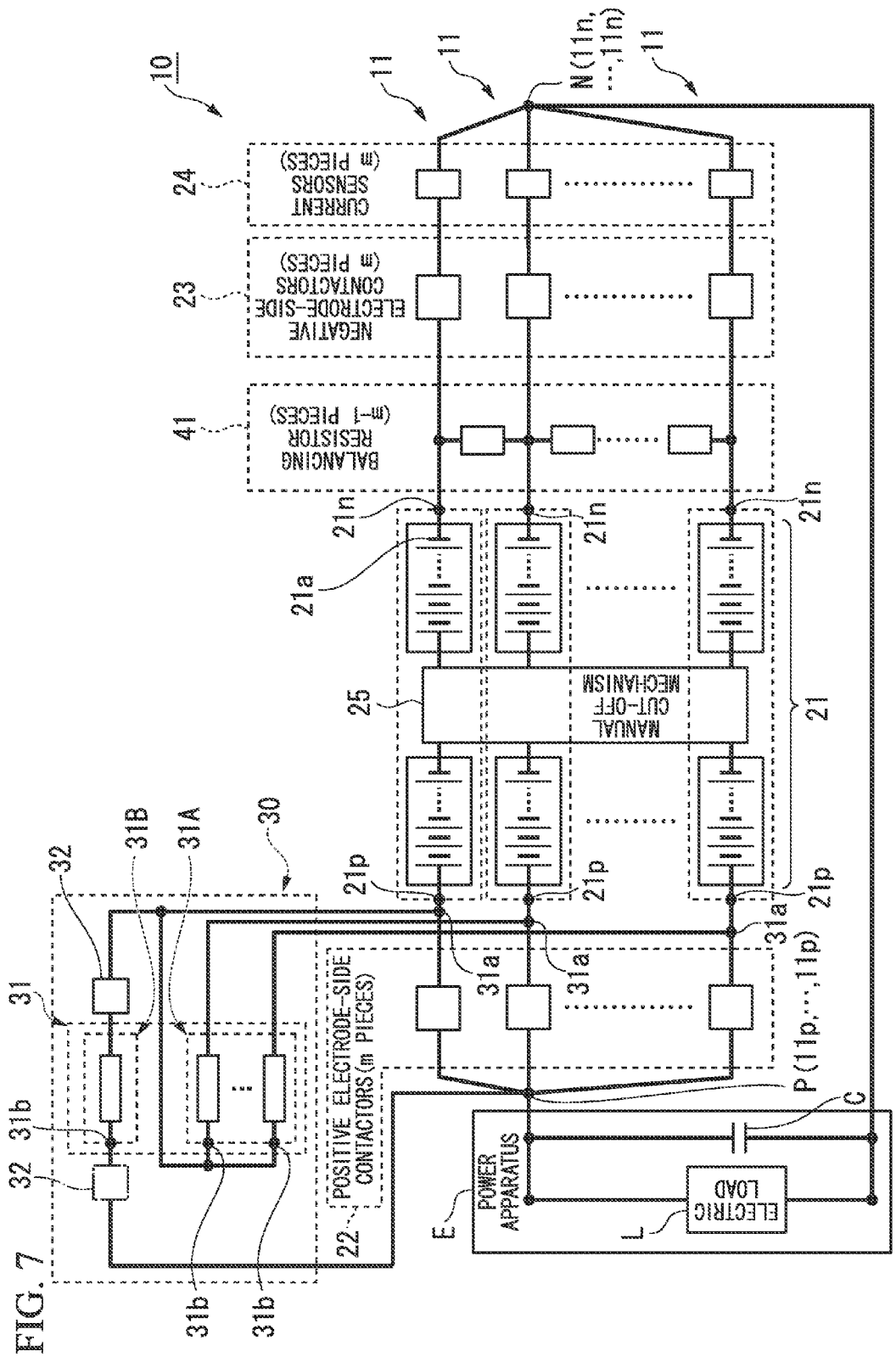
FIG. 7 is a view showing an example of the configuration of a power supply device according to a second modification of the embodiment of the invention.

Meanwhile, in the above-mentioned embodiment, as in, for example, a power supply device 10 according to a second modification of the above-mentioned embodiment shown in FIG. 7, m−1 balancing resistors 41, ..., 41, which connect the battery units 21, may be provided between the negative electrode terminals 21n of m battery units 21, ..., 21 and m negative electrode-side contactors 23, ..., 23 on the side close to the electrode terminals, to which the precharge resistors 31 are not connected, of the positive electrode terminals 21p and the negative electrode terminals 21n of the battery units 21, for example, the negative electrode terminals 21n shown in FIG. 7.

In the power supply device 10 according to the second modification, the number (m−1) of the balancing resistors 41, ..., 41 is smaller than the number (m) of the battery units 21, ..., 21 by one as shown in, for example, FIGS. 8 to 11. Accordingly, the number of the battery units 21, which are connected to only one balancing resistor 41, is two or more.

Therefore, among m battery units 21, ..., 21, the battery units 21, ..., 21, of which the number is larger than 1 and smaller than m, are connected to one other battery unit 21.

Further, since m battery units 21, ..., 21 are connected to each other by m−1 balancing resistors 41, ..., 41, each of all the battery units 21, ..., 21 cannot be connected to only one other battery unit 21 by one balancing resistor 41.

Accordingly, the number of battery units 21, which are connected to only one other battery unit 21 by one balancing resistor 41, among m battery units 21, ..., 21 is smaller than m.

Figure 8:
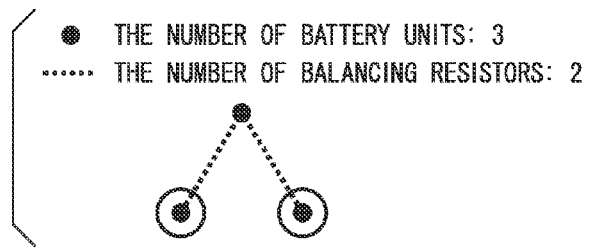
FIG. 8 is a view showing an example of the connection between m battery units and m−1 balancing resistors when m of the power supply device according to the second modification of the embodiment of the invention is 3.

In the connection between m battery units 21, 21, and 21 and m−1 balancing resistors 41 and 41 in the case of, for example, "m=3" shown in FIG. 8, among m battery units 21, 21, and 21, one battery unit 21 is connected to two other battery units 21 and 21 by two balancing resistors 41 and 41 and each of two other battery units 21 and 21 is connected to the other battery unit 21 by one balancing resistor 41.

Figure 9A:
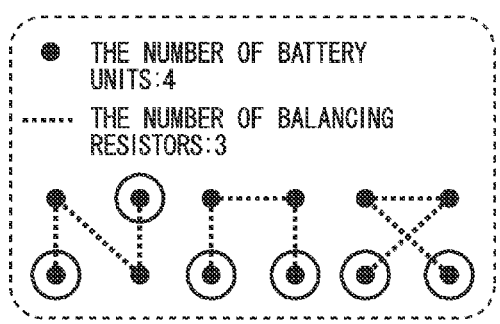
FIGS. 9A and 9B are views showing an example of the connection between m battery units and m−1 balancing resistors when m of the power supply device according to the second modification of the embodiment of the invention is 4.
Figure 9B:
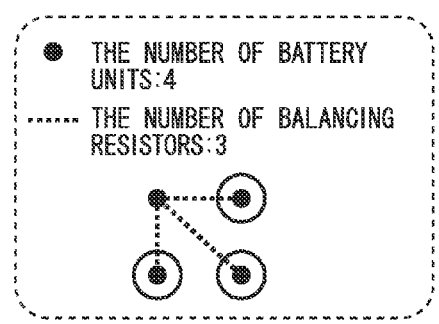

Further, in the connection between m battery units 21, ..., 21 and m−1 balancing resistors 41, ..., 41 in the case of, for example, "m=4" shown in FIGS. 9A and 9B, as shown in, for example, FIG. 9A, among m battery units 21, ..., 21, each of two battery units 21 and 21 is connected to two other battery units 21 and 21 by two balancing resistors 41 and 41 and each of two battery units 21 and 21 is connected to one other battery unit 21 by one balancing resistor 41.

Furthermore, as shown in, for example, FIG. 9B, among m battery units 21, ..., 21, one battery unit 21 is connected to three other battery units 21, 21, and 21 by three balancing resistors 41, 41, and 41 and each of the three battery units 21, 21, and 21 is connected to one other battery unit 21 by one balancing resistor 41.

Figure 10A:
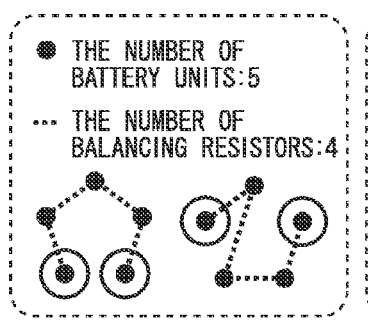
FIGS. 10A, 10B and 10C are views showing an example of the connection between m battery units and m−1 balancing resistors when m of the power supply device according to the second modification of the embodiment of the invention is 5.
Figure 10B:
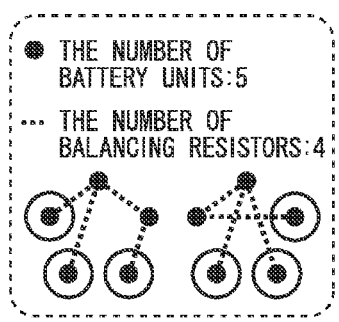
Figure 10C:
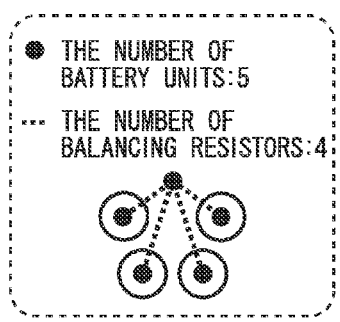

Further, in the connection between m battery units 21, ..., 21 and m−1 balancing resistors 41, ..., 41 in the case of, for example, "m=5" shown in FIGS. 10A to 10C, as shown in, for example, FIG. 10A, among m battery units 21, ..., 21, each of three battery units 21, 21, and 21 is connected to two other battery units 21 and 21 by two balancing resistors 41 and 41 and each of two battery units 21 and 21 is connected to one other battery unit 21 by one balancing resistor 41.

Furthermore, as shown in, for example, FIG. 10B, among m battery units 21, ..., 21, one battery unit 21 is connected to three other battery units 21, 21, and 21 by three balancing resistors 41, 41, and 41, one battery unit 21 is connected to two other battery units 21 and 21 by two balancing resistors 41 and 41, and each of three battery units 21, 21, and 21 is connected to one other battery unit 21 by one balancing resistor 41.

Moreover, as shown in, for example, FIG. 10C, among m battery units 21, ..., 21, one battery unit 21 is connected to four other battery units 21, ..., 21 by four balancing resistors 41, ..., 41 and each of four battery units 21, ..., 21 is connected to one other battery unit 21 by one balancing resistor 41.

Figure 11A:
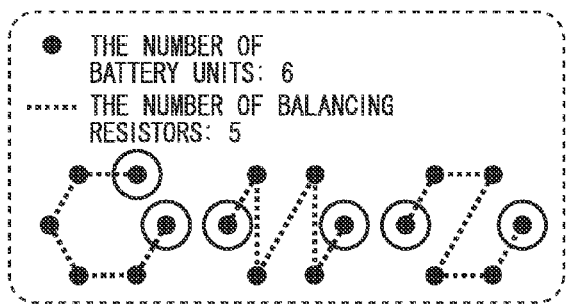
FIGS. 11A, 11B, 11C, 11D and 11E are views showing an example of the connection between m battery units and m−1 balancing resistors when m of the power supply device according to the second modification of the embodiment of the invention is 6.

Further, in the connection between m battery units 21, ..., 21 and m−1 balancing resistors 41, ..., 41 in the case of, for example, "m=6" shown in FIGS. 11A to 11E, as shown in, for example, FIG. 11A, among m battery units 21, ..., 21, each of four battery units 21, ..., 21 is connected to two other battery units 21 and 21 by two balancing resistors 41 and 41 and each of two battery units 21 and 21 is connected to one other battery unit 21 by one balancing resistor 41.

Figure 11B:
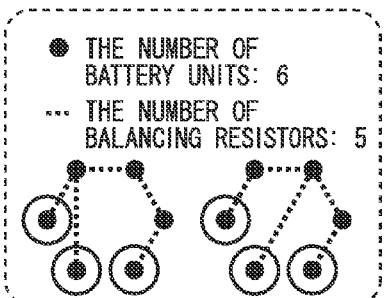

Furthermore, as shown in, for example, FIG. 11B, among m battery units 21, ..., 21, one battery unit 21 is connected to three other battery units 21, 21, and 21 by three balancing resistors 41, 41, and 41, each of two battery units 21 and 21 is connected to two other battery units 21 and 21 by two balancing resistors 41 and 41, and each of three battery units 21, 21, and 21 is connected to one other battery unit 21 by one balancing resistor 41.

Figure 11C:
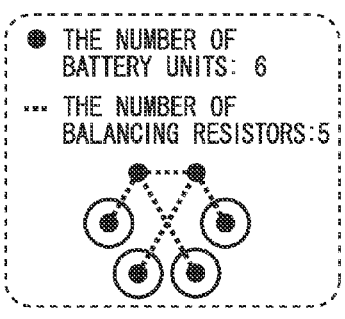

Moreover, as shown in, for example, FIG. 11C, among m battery units 21, ..., 21, each of two battery units 21 and 21 is connected to three other battery units 21, 21, and 21 by three balancing resistors 41, 41, and 41 and each of four battery units 21, ..., 21 is connected to one other battery unit 21 by one balancing resistor 41.

Figure 11D:
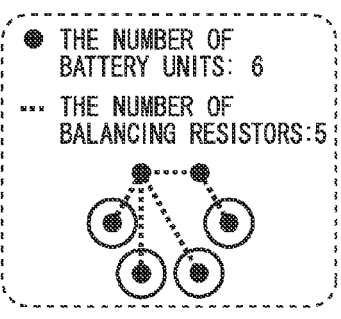

Further, as shown in, for example, FIG. 11D, among m battery units 21, ..., 21, one battery unit 21 is connected to four other battery units 21, ..., 21 by four balancing resistors 41, ..., 41, one battery unit 21 is connected to two other battery units 21 and 21 by two balancing resistors 41 and 41, and each of four battery units 21, ..., 21 is connected to one other battery unit 21 by one balancing resistor 41.

Figure 11E:
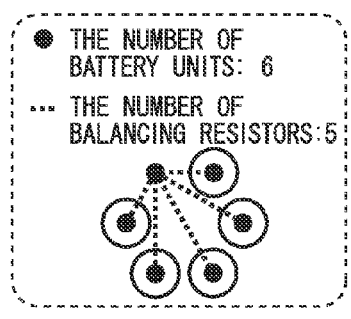

Furthermore, as shown in, for example, FIG. 11E, among m battery units 21, ..., 21, one battery unit 21 is connected to four other battery units 21, ..., 21 by four balancing resistors 41, ..., 41 and each of four battery units 21, ..., 21 is connected to one other battery unit 21 by one balancing resistor 41.

According to the second modification, closed-loop circuits where m battery units 21, ..., 21 are connected to each other by m−1 balancing resistors 41, ..., 41 and m−1 precharge resistors 31 (31A), ..., 31 (31A) are formed regardless of the connection/disconnection states of m negative electrode-side contactors 23, ..., 23. Accordingly, it is possible to appropriately eliminate the variation of voltage (the variation of capacity) between the plurality of battery units 21, ..., 21.

Moreover, it is possible to appropriately eliminate the variation of voltage (the variation of capacity) between the plurality of battery units 21, ..., 21 while preventing the number of required balancing resistors 41 from being excessively increased.

Meanwhile, in the above-mentioned embodiment, as in, for example, a power supply device 10 according to a third modification of the above-mentioned embodiment shown in FIG. 12, m balancing resistors 41, ..., 41, which connect the battery units 21, may be provided on the side close to the electrode terminals, to which the precharge resistors 31 are not connected, of the positive electrode terminals 21p and the negative electrode terminals 21n of the battery units 21, for example, the negative electrode terminals 21n shown in FIG. 12.

For example, the power supply device 10 shown in FIG. 12 includes m balancing resistors 41, ..., 41 that connect the battery units 21 and are provided between the negative electrode terminals 21n of m battery units 21, ..., 21 and m negative electrode-side contactors 23, ..., 23.

According to the third modification, it is possible to connect m balancing resistors 41, ..., 41 to m battery units 21, ..., 21 by delta connection.

Accordingly, even though abnormality occurs in one balancing resistor 41, it is possible to appropriately maintain closed-loop circuits where m battery units 21, ..., 21 are connected to each other by m−1 balancing resistors 41, ..., 41 and m−1 precharge resistors 31 (31A), ..., 31 (31A). Further, it is possible to appropriately eliminate the variation of voltage (the variation of capacity) between the plurality of battery units 21, ..., 21.

Meanwhile, in the second and third modifications of the above-mentioned embodiment, the plurality of current sensors 24, ..., 24 may be disposed on the outside of closed-loop circuits where m battery units 21, ..., 21 are connected to each other by a plurality of (m or m−1) balancing resistors 41, ..., 41 and m−1 precharge resistors 31, ..., 31.

As in, for example, a power supply device 10 according to a fourth modification of the above-mentioned embodiment shown in FIG. 13, a current sensor 24 may be connected between the balancing resistor 41 and the negative electrode-side contactor 23 in each of the power supply units 11.

As in the fourth modification, a plurality of current sensors 24, ..., 24 are disposed on the outside of closed-loop circuits where m battery units 21, ..., 21 are connected to each other by a plurality of (m or m−1) balancing resistors 41, ..., 41 and m−1 precharge resistors 31 (31A), ..., 31 (31A). Therefore, it is possible to appropriately calibrate the current sensors 24.

Meanwhile, in the above-mentioned embodiment, as in, for example, a power supply device 10 according to a fifth modification of the above-mentioned embodiment shown in FIG. 14, current sensors 24 may be omitted from the power supply units 11.

Meanwhile, in the above-mentioned embodiment, as in, for example, a power supply device 10 according to a sixth modification of the above-mentioned embodiment shown in FIG. 15, relays, which can disconnect the battery units 21 from an external power apparatus E, that is, negative electrode-side contactors 23 may be omitted from the side close to the electrode terminals, to which the precharge resistors 31 are not connected, of the positive electrode terminals 21p and the negative electrode terminals 21n of the respective battery units 21, for example, the negative electrode terminals 21n shown in FIG. 15.

While preferred embodiments of the present invention have been described and illustrated above, it should be understood that these are exemplary of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the appended claims.

What is claimed is:

1. A power supply device, comprising a plurality of power supply units connected in parallel, and includes a positive electrode-side junction formed by the joining of positive electrode-side terminals of the plurality of power supply units and a negative electrode-side junction formed by the joining of negative electrode-side terminals of the plurality of power supply units, wherein each of the plurality of power supply units includes a battery unit, and a first relay that is provided between one of the positive and negative electrode-side junctions and the battery unit and is electrically disconnectably connected in series to the battery unit, each of the plurality of power supply units includes a resistive element of which one end is connected between the first relay, which is connected to one of a positive electrode terminal and a negative electrode terminal of the battery unit, and the battery unit, and the other end of the first resistive element is connected to one of the positive and negative electrode-side junctions, each of the plurality of power supply units other than the plurality of power supply units connected to the first resistive element includes a second resistive element of which one end is connected between the first relay, which is connected to one of the positive electrode terminal and the negative electrode terminal of the battery unit, and the battery unit, the other end of the second resistive element is connected to one end of the first resistive element via a connection part, and second relays that cut off current flowing to one of the positive and negative electrode-side junctions connected to the first relays of the plurality of power supply units from the plurality of power supply units through the other resistive elements and allow the flow of the current.

2. The power supply device according to claim 1, wherein if the number of the other resistive elements is one, the second relays are connected between the other end of the other resistive element and any one, which is connected to the first relays, of the positive and negative electrode-side junctions or between the other resistive element and the other end of the at least one resistive element.

3. The power supply device according to claim 1, wherein if the number of the other resistive elements is two or more, the second relays are connected between the other ends of the other resistive elements and any one, which is connected to the first relays, of the positive and negative electrode-side junctions.

4. The power supply device according to claim 1, further comprising:

third relays that are electrically disconnectably connected between the other of the positive and negative electrode-side junctions and the battery units.

5. The power supply device according to claim 4, further comprising:

balancing resistive elements that are provided between the battery units of the plurality of power supply units and the third relays and connect the battery units, wherein the third relays are connected in series to the battery units of the plurality of power supply units and the number of the third relays is equal to the number of the plurality of power supply units.

6. The power supply device according to claim 5, wherein the number of the balancing resistive elements is set to m−1 when the number of the battery units is an arbitrary natural number m of 2 or more, and among the m battery units, the battery units of which the number is larger than 1 and smaller than m are connected to the other one battery unit.

7. The power supply device according to claim 5, wherein the number of the balancing resistive elements is set to m when the number of the battery units is an arbitrary natural number m of 2 or more, and among the m battery units, all the battery units are connected to the other two battery units.

8. The power supply device according to claim 5, wherein the battery units of the plurality of power supply units include current sensors on the outside of closed-loop circuits that includes the battery units, the resistive elements, and the balancing resistive elements.

* * * * *